(12) United States Patent
Kim et al.

(10) Patent No.: US 6,383,867 B1
(45) Date of Patent: May 7, 2002

(54) METHOD OF MANUFACTURING SEMICONDUCTOR MEMORY DEVICE

(75) Inventors: Jae Young Kim; Tae Jin Kang, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 3 days.

(21) Appl. No.: 09/597,601

(22) Filed: Jun. 20, 2000

(30) Foreign Application Priority Data

Jun. 21, 1999 (KR) .......................... 99-23187

(51) Int. Cl.$^7$ ......................... H01L 21/8242
(52) U.S. Cl. ................. 438/253; 438/254; 438/255; 438/256
(58) Field of Search .................... 438/253, 254, 438/255, 256, 381

(56) References Cited

U.S. PATENT DOCUMENTS

| 5,753,547 | A | | 5/1998 | Ying | |
|---|---|---|---|---|---|
| 5,759,888 | A | | 6/1998 | Wang et al. | |
| 5,807,775 | A | * | 9/1998 | Tseng | 438/253 |
| 5,827,766 | A | | 10/1998 | Lou | |
| 5,856,220 | A | * | 1/1999 | Wang et al. | 438/254 |
| 5,897,983 | A | | 4/1999 | Hirota et al. | |
| 5,956,587 | A | * | 9/1999 | Chen et al. | 438/255 |
| 6,001,682 | A | | 12/1999 | Chien | |
| 6,010,943 | A | | 1/2000 | Liao | |
| 6,015,733 | A | | 1/2000 | Lee et al. | |
| 6,020,234 | A | | 2/2000 | Li et al. | |

FOREIGN PATENT DOCUMENTS

| JP | 6209084 | 7/1994 |
|---|---|---|
| JP | 714931 | 1/1995 |
| JP | 1187644 | 3/1999 |

* cited by examiner

*Primary Examiner*—Matthew Smith
*Assistant Examiner*—Victor Yevsikov
(74) *Attorney, Agent, or Firm*—Pillsbury Winthrop LLP

(57) ABSTRACT

A method for forming an inner cylinder type storage electrode of a semiconductor memory device, comprising the steps of: forming a first insulating layer on a substrate; etching the first insulating layer to form a contact hole, thereby exposing a portion of the substrate; forming a conductive film for a storage electrode over the first insulating layer including the contact hole; forming a photosensitive film in a portion of the contact hole over the conductive film; forming a second insulating layer to be completely filled in the contact hole over the photosensitive film; etching the second insulating layer and the conductive film to expose the first insulating layer, thereby forming the storage electrode; and removing the first and second insulating layers and the photosensitive film.

6 Claims, 8 Drawing Sheets

V

A

METHOD OF MANUFACTURING SEMICONDUCTOR MEMORY DEVICE

BACKGROUND OF THE INVENTION

1. Field of the Invention

This invention relates to a method for fabricating a semiconductor memory device, and more particularly to a method for forming an inner cylinder type storage electrode of a semiconductor memory device.

2. Description of the Related Art

With the increase of the integration degree of a semiconductor memory device, because the cell dimension and the space between cells become diminished and a capacitor should have a constant capacitance, it should demand the capacitor having a large capacitance in a narrow dimension. Recently, an inner cylinder type storage electrode is adapted so as to ensure the capacitance of a capacitor in a semiconductor memory device of above 256 mega DRAM.

FIG. 1a to FIG. 1c shows sectional views illustrating a method for forming an inner cylinder type storage electrode of a semiconductor memory device in the prior art. Referring to FIG. 1a, a first insulating layer 11 is formed on a substrate 10 and etched to form contact holes for capacitors, thereby exposing portions of the substrate 10. A conductive film 12 for storage electrode is formed over the first insulating layer 11 including the contact holes. A second insulating layer 13 is formed over the conductive film 12 to be filled in the contact holes.

Referring to FIG.1b, the second insulating layer 13 and the conductive film 12 are blanket-etched to expose the first insulating layer 11. The conductive film 12 is separated with each other to form inner cylinder type storage electrodes 12A and 12B within the contact holes.

Referring to FIG. 1c, the second insulating layer 13 and the first insulating layer 11 are wet-etched. At this time, a portion of the first insulating layer 13 which is disposed outside of the storage electrodes 12A and 12B remains by a selected thickness by controlling the etching selectivity between the first and second insulating layers 11 and 13.

With increase of the integration degree, because the area occupied by the storage electrode of the capacitor is diminished and the height of the cylinder type storage electrode becomes high, its aspect ratio is increased. Therefore, the filling property of the second insulating layer 13 which is filled in the cylinder type storage electrodes 12A and 12B becomes degraded so that the void V is occurred in the second insulating layer 13 as shown in FIG. 2. Besides, the inner portions of the storage electrodes are not protected due to the void V in the following blanket-etching process of the second insulating layer 13 so that the bottoms of the storage electrodes are damaged as A shown in FIG. 3.

So as to solve the problem, the method for selectively filling a photosensitive film 50 only in the inner portions of the storage electrodes instead of the second insulating layer 13, is proposed. However, when the photosensitive film 50 is filled with the inner type storage electrodes, it is difficult to control the height of the photosensitive film 50 to be equal to or lower than that of the storage electrodes. Therefore, the storage electrode has a profile of a spacer type not a plan profile as B shown in FIG. 5, after the conductive film is blanket-etched. The spacer type cylinder causes the focusing of the electric field to break the dielectric film of the capacitor. Besides, as shown in FIG. 6a and FIG. 6b, if hemi-spherical grains are formed over the inner cylinder type storage electrode having a spacer type profile so as to enhance the surface dimension of the storage electrode, the hemi-spherical grains are unstable and then detached from the storage electrode with ease. Therefore, the probability for the bridge between the storage electrodes becomes high.

SUMMARY OF THE INVENTION

It is an object of the present invention to provide a method for fabricating a semiconductor memory device for preventing the bottom of the inner cylinder type storage electrode from damaging and for obtaining the plan cylinder profile.

According to an aspect of the present invention, there is provided to a method for fabricating a semiconductor memory device, comprising the steps of: forming a first insulating layer over a substrate; etching the first insulating layer to form contact hole, thereby exposing a portion of the substrate; forming a conductive film for a storage electrode over the first insulating layer including the contact hole; forming a photosensitive film over only the conductive film within the contact hole; forming a second insulating layer over the first insulating layer to be filled in the contact hole; blanket-etching the second insulating layer and the conductive film to expose the first insulating layer, thereby forming the storage electrode; and removing the photosensitive film and the first and the second insulating layers.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1A:
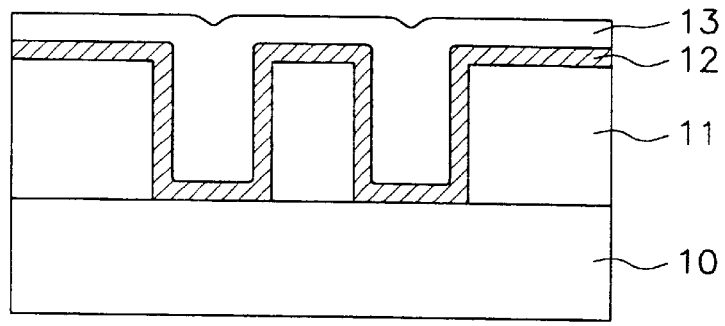
FIG. 1a to FIG. 1c are sectional views illustrating a method for forming an inner cylinder type storage electrode of a semiconductor memory device in the prior art.
Figure 1B:
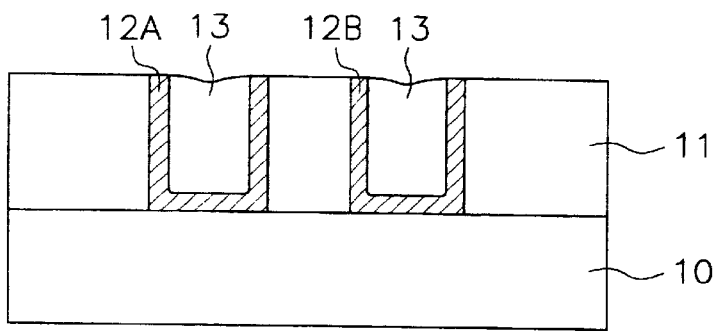
Figure 1C:
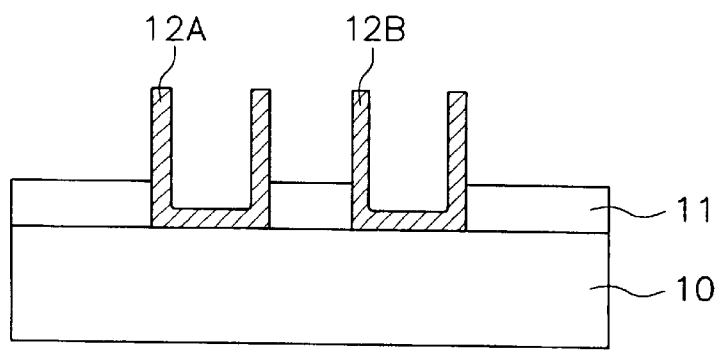
Figure 2:
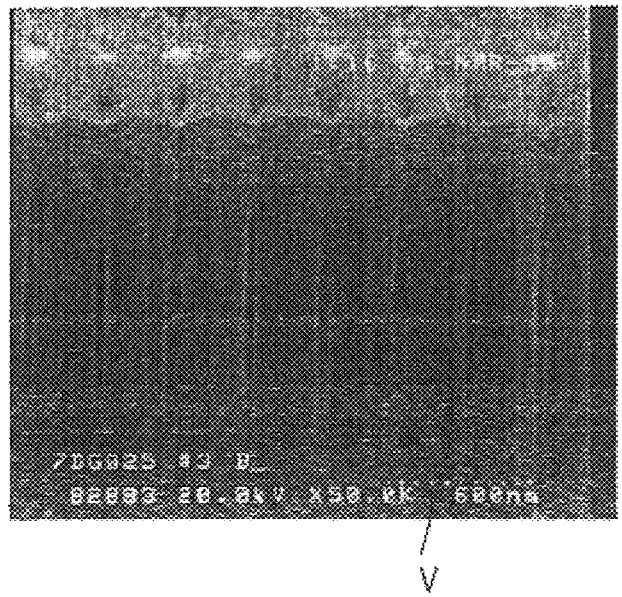
FIG. 2 and FIG. 3 are sectional views illustrating the void in an insulating layer and the damage in the bottom of the inner cylinder type storage electrode in the prior art, respectively.
Figure 3:
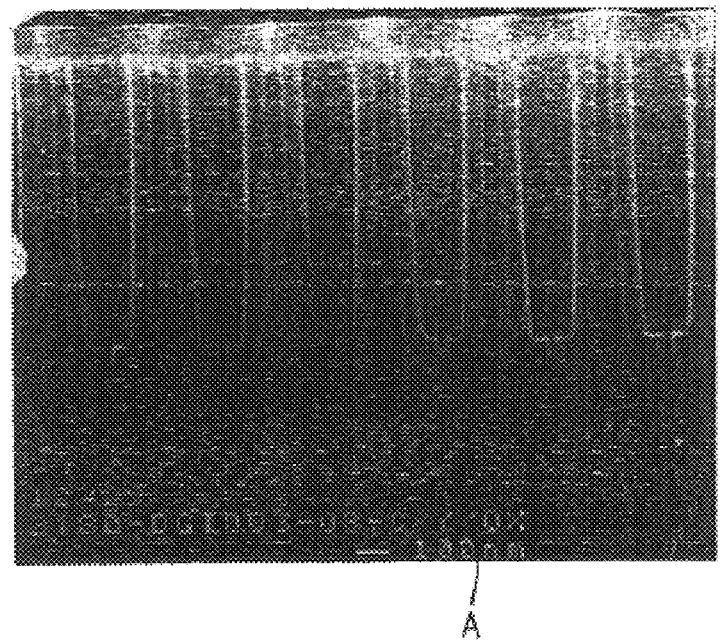
Figure 4:
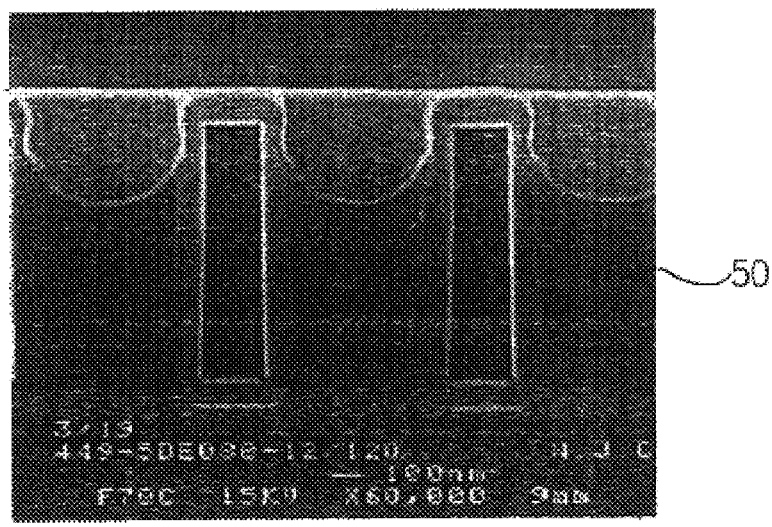
FIG. 4 is a sectional view of a semiconductor memory device where a photosensitive film is filled in an inner cylinder type storage electrode in the prior art.
Figure 5:
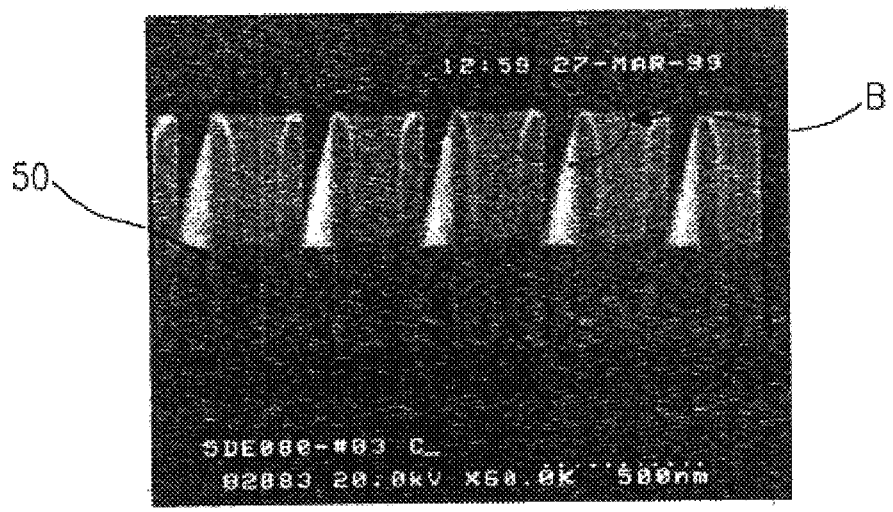
FIG. 5 is a sectional view of a semiconductor memory device where a conductive film is blanket-etched in the prior art.
Figure 6A:
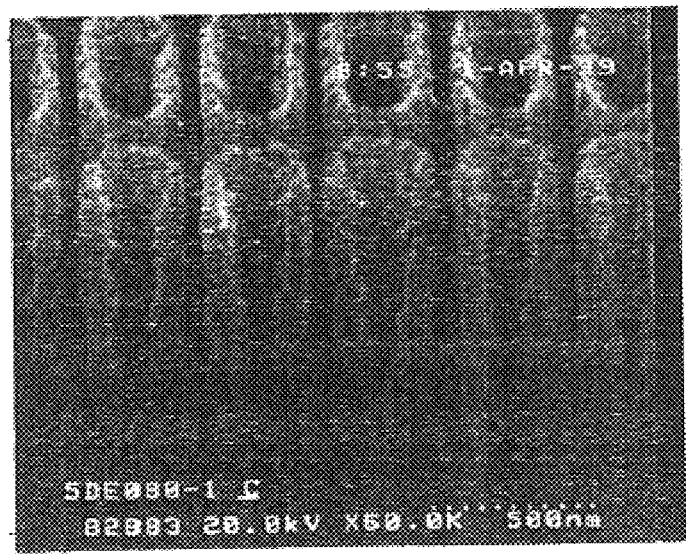
FIG. 6a and FIG. 6b are sectional views of semiconductor memory devices where hemi-spherical grains are adapted to the inner cylinder type storage electrode in the prior art.
Figure 6B:
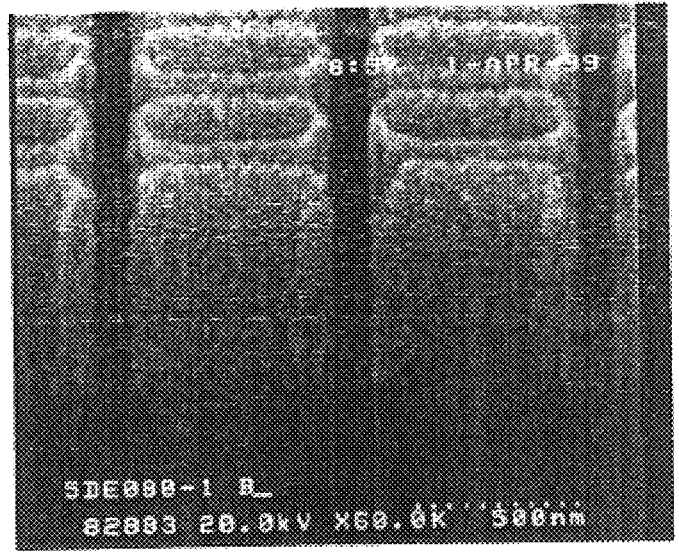
Figure 7A:
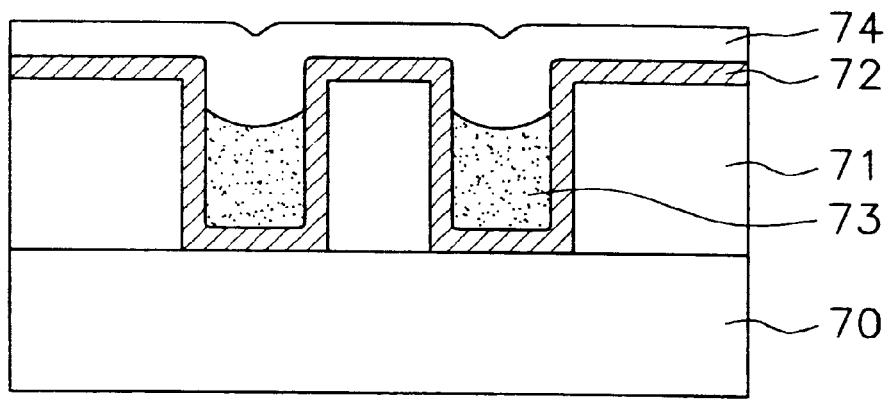
FIG. 7a to FIG. 7d are sectional views illustrating a method for forming an inner cylinder type storage electrode of a semiconductor memory device in accordance with an embodiment of the present invention.

FIG. 7a to FIG. 7d are sectional views illustrating a method for forming an inner cylinder type storage electrode of a semiconductor memory device in accordance with an embodiment of this invention. Referring to FIG. 7a, a first insulating layer 71 is formed on a substrate 70 and it is etched to form contact holes for capacitors, thereby exposing portions of the substrate 70. Herein, the first insulating layer 71 is comprised of a BPSG film, a PSG film or an O₃-TEOS oxide film. A conductive film 72 for storage electrode is formed over the first insulating layer 71 including contact holes. Herein, the conductive film 72 is a film doped with impurities such as As or P. The undoped conductive film is deposited and then impurities are injected by a selected thickness with an ion implantation method or a diffusion method to form the conductive film 72.

A photosensitive film 73 is coated on the conductive film to be filled in the contact holes. The light is selectively radiated to the photosensitive film 73. The photosensitive film 73 is developed to partially remove so that it remains only in the contact holes and the remaining photosensitive film 73 is hardened. The photosensitive film 73 is comprised of a solution-resistant i-line photosensitive film or a chemical enhanced-DUV photosensitive film. The photosensitive film 73 is hardened at a temperature of 100° to 200° C. Preferably, it is hardened by sequentially controlling the temperature at 100° C., 150° C. or 200° C. At this time, the photosensitive film 73 is formed to be lower in a height than the contact hole so that it is filled in the bottom of the contact hole as shown in FIG. 7a.

A second insulating layer 74 is formed over the conductive film 72 to be completely filled in the contact holes. The second insulating layer 74 is comprised of a BPSG film, a PSG film or O₃-TEOS film and may be formed by a plasma enhanced chemical vapor deposition method (PECVD) at a temperature of 300 to 450° C. At this time, the high aspect ratio of the contact hole is reduced by the photosensitive film 73 filled in the bottom of the contact hole and the filling property of the second insulating layer 74 is improved to reduce the probability of the void.

Figure 7B:
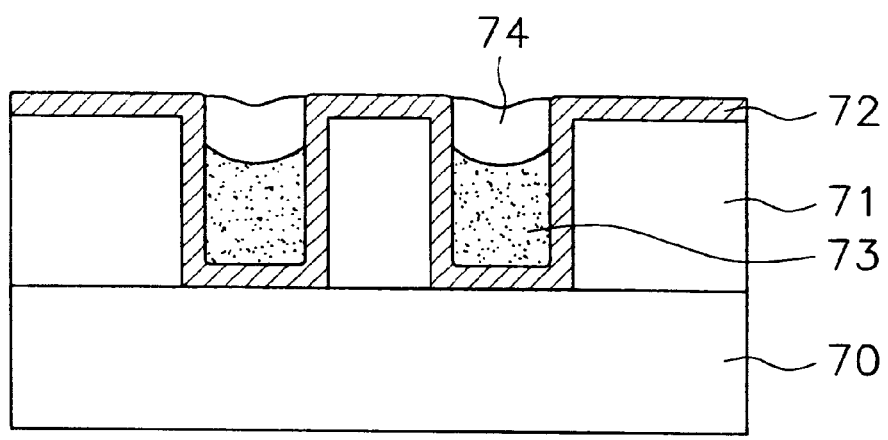
Figure 7C:
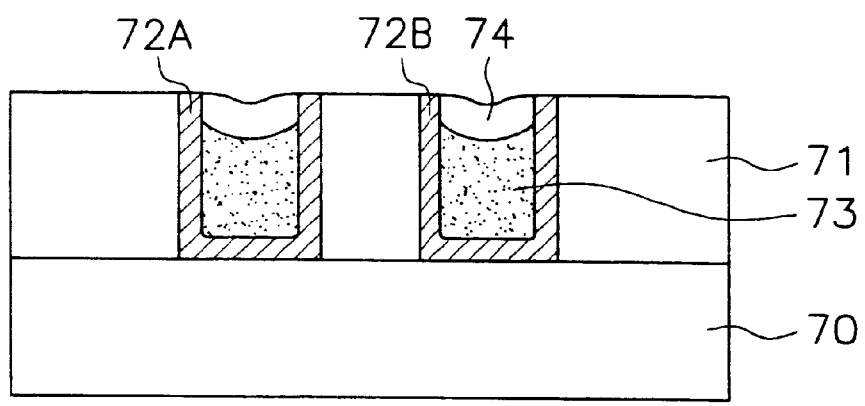

As shown in FIG. 7b, the second insulating layer 74 is blanket-etched to expose the conductive film 72 and as shown in FIG.7c, the conductive film 72 is blanket-etched to expose the first insulating layer 71, thereby forming inner cylinder type storage electrodes 72A and 72B.

Figure 8A:
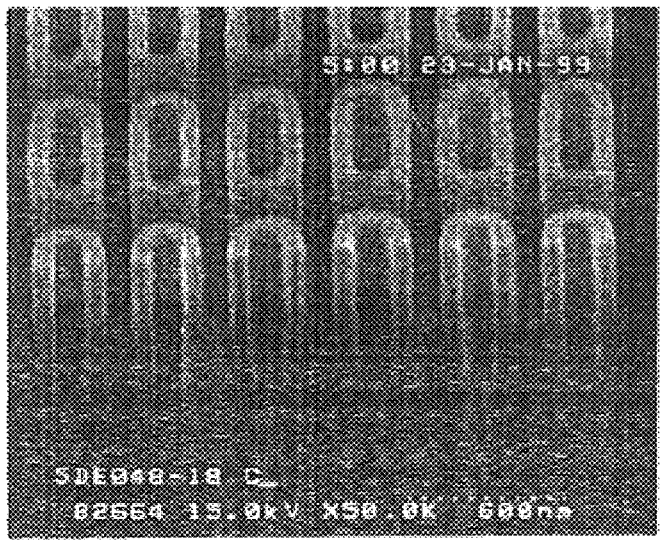
FIG. 8a and FIG. 8b are sectional views of the inner cylinder type storage electrode in the present invention.
Figure 8B:
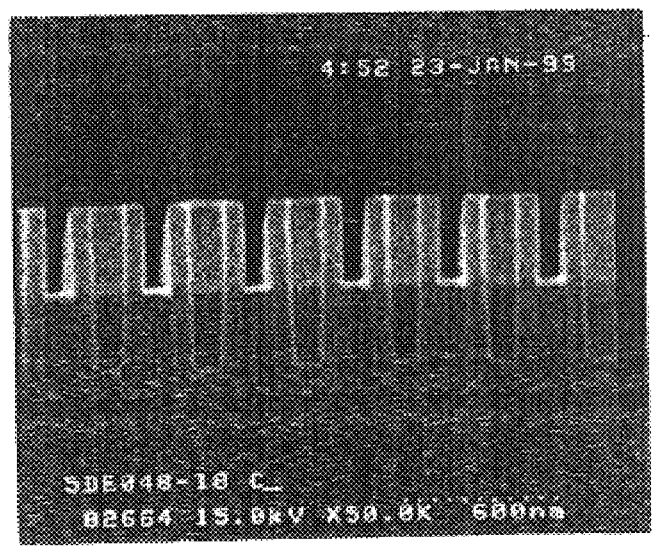

FIG. 8a and FIG. 8b are sectional views illustrating the storage electrodes formed by blanket-etching the conductive film 72. The void in the second insulating layer 74 and the damage in the bottom of the storage electrode are not occurred. For example, although the void is occurred in the second insulating layer 74, the bottom of the storage electrode is completely covered by the photosensitive film 73 and the damage in the bottom of the cylinder type storage electrode due to the following etching process can be prevented. After the second insulating layer 74 is completely filled in the contact holes over the photosensitive film 73, the etching process is carried out so that the inner cylinder type storage electrodes having plan profiles is obtained.

Figure 7D:
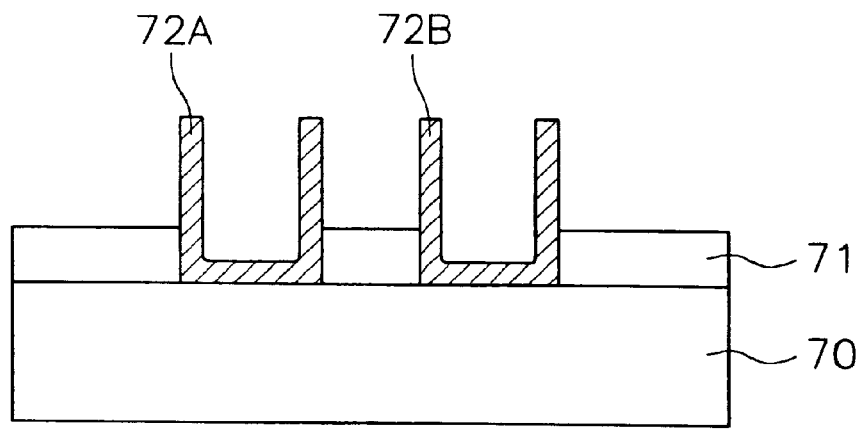

As shown in FIG. 7d, the first and second insulating layers 71 and 74 are removed by a wet etching process using a HF solution and BOE and then the photosensitive film 73 is removed. At this time, the first insulating layer 71 outside of the storage electrode s 72A and 72B remains at a selected thickness by controlling the wet etching selectivity of the first and second insulating layers 71 and 74 that the second insulating layer 74 is etched faster than the fist insulating layer 71.

Figure 9A:
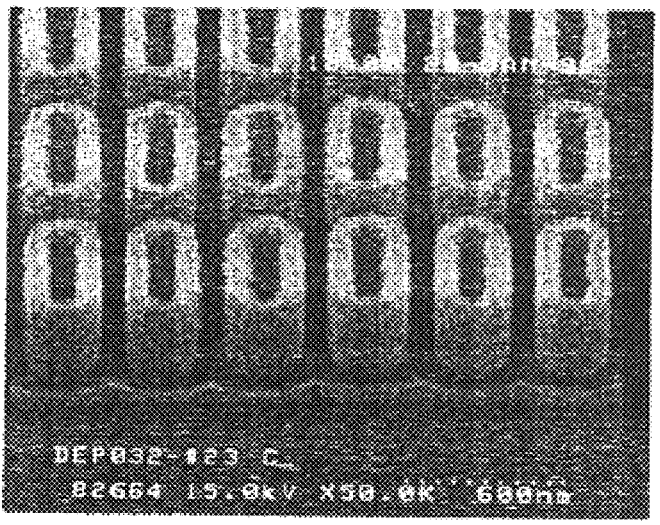
FIG. 9a and FIG. 9b are sectional views of a semiconductor memory device where hemi-spherical grains are adapted to the inner cylinder type storage capacitor in the present invention.
Figure 9B:
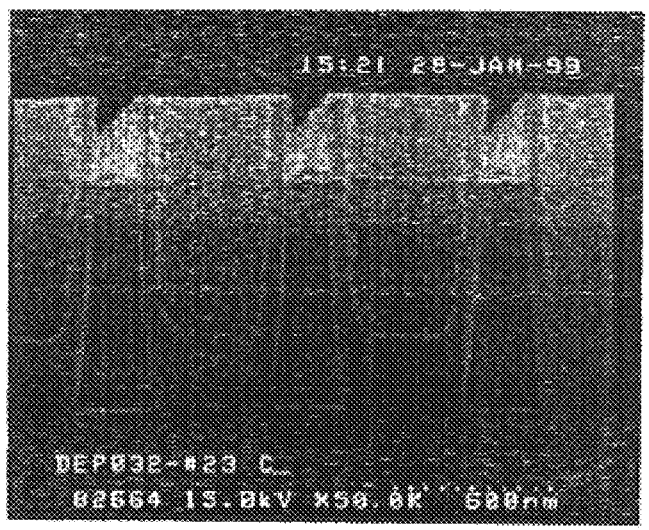

Besides, so as to enhance the surface dimension of the storage electrodes 72A and 72B, hemi-spherical grains are formed on the surfaces of the storage electrodes 72A and 72B. As shown in FIGS. 9a and 9b, the hemi-spherical grains are stable formed on the storage electrodes 72A and 72B, so that the bridge between the adjacent storage electrodes as the prior art is not occurred in the present invention.

According to the present invention, after the cylinder having a high aspect ratio is filled with a photosensitive film and an insulating layer, the etching process for storage electrode is carried out. Therefore, the occurrence of the void and the damage in the bottom of the storage electrode can be prevented. Besides, the present invention can obtain the inner cylinder type storage electrode having a plan profile so that it is applicable to adapt hemi-spherical grains to the storage electrode without the occurrence of the bridge between the storage electrodes.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for fabricating a semiconductor memory device, comprising the steps of:

forming a first insulating layer on a substrate;

etching the first insulating layer to form a contact hole, thereby exposing a portion of the substrate;

forming a conductive film for a storage electrode over the first insulating layer including the contact hole;

forming a photosensitive film in a portion of the contact hole over the conductive film;

forming a second insulating layer to be completely filled in the contact hole over the photosensitive film;

etching the second insulating layer and the conductive film to expose the first insulating layer, thereby forming the storage electrode; and removing the first and second insulating layers and the photosensitive film;

wherein the steps for forming the photosensitive film includes the steps of:

coating the photosensitive film over the conductive film to be filled in the contact hole;

selectively radiating light to the photosensitive film;

developing the photosensitive film to remain in the portion of the contact hole; and hardening the photosensitive film.

2. The method as claimed in claim 1, wherein the photosensitive film is comprised of any one of a solution-resistant i-line photosensitive film or a chemical enhanced-DUV photosensitive film.

3. The method as claimed in claim 1, wherein the photosensitive film is hardened by sequentially controlling the temperature of 100 to 200° C.

4. The method as claimed in claim 1, wherein the first insulating layer comprises any one of a BPSG film, a PSG film or an O₃-TEOS film; and the second insulating film comprises any one of a BSPG film, a PSG film, or an O₃-TEOS film.

5. The method as claimed in claim 4, wherein the second insulating layer is formed by a PECVD method at a temperature of 300 to 450° C.

6. The method as claimed in claim 5, wherein the first and second insulating layers are removed by a wet etching process using HF or BOE.

* * * * *